United States Patent [19]
Meyyappan et al.

[11] Patent Number: 5,589,407
[45] Date of Patent: Dec. 31, 1996

[54] METHOD OF TREATING SILICON TO OBTAIN THIN, BURIED INSULATING LAYER

[75] Inventors: Narayanan Meyyappan, Camas; Tatsuo Nakato, Vancouver, both of Wash.

[73] Assignee: Implanted Material Technology, Inc.

[21] Appl. No.: 524,039

[22] Filed: Sep. 6, 1995

[51] Int. Cl.⁶ .................................................. H01L 21/265
[52] U.S. Cl. ................................................ 437/26; 437/24
[58] Field of Search ................................. 437/24, 26, 27, 437/62

[56] References Cited

U.S. PATENT DOCUMENTS

| | | |
|---|---|---|
| 4,317,686 | 3/1982 | Anand et al. . |
| 4,676,841 | 6/1987 | Ceiler . |
| 4,740,481 | 4/1988 | Wilson et al. . |
| 4,786,608 | 11/1988 | Griffith .................................. 437/26 |
| 4,810,664 | 3/1989 | Kamins et al. . |
| 4,837,172 | 6/1989 | Mizuno et al. . |
| 4,975,126 | 12/1990 | Margail et al. . |
| 5,047,356 | 9/1991 | Li et al. . |
| 5,080,730 | 1/1992 | Wittkower . |
| 5,143,858 | 9/1992 | Tomazane et al. . |
| 5,196,355 | 3/1993 | Wittkower . |
| 5,278,077 | 1/1994 | Nakato ..................................... 437/27 |
| 5,288,650 | 2/1994 | Sandow ................................... 437/26 |
| 5,310,689 | 5/1994 | Tomdzane et al. ...................... 437/26 |
| 5,395,771 | 3/1995 | Nakato et al. ........................... 437/24 |
| 5,429,955 | 7/1995 | Joyner et al. ............................ 437/26 |
| 5,436,175 | 7/1995 | Nakato et al. . |
| 5,441,899 | 8/1995 | Nakai et al. ............................. 437/24 |
| 5,468,657 | 11/1995 | Hsu ........................................... 437/24 |

FOREIGN PATENT DOCUMENTS

| | | |
|---|---|---|
| 55-162235 | 12/1980 | Japan . |
| 58-54638 | 3/1983 | Japan . |
| 61-142755 | 6/1986 | Japan . |

OTHER PUBLICATIONS

"Buried Layers of Silicon Oxy–Nitride Fabricated Using Ion Beam Synthesis," by K. J. Reeson et al., 1988, 427–432, *Nuclear Instruments and Methods*.

"Ion Implanation—An Industrial Technique for Wide Applications in the Field of Economic Surface Modification" (Ranke et al) 1990, 535–546 *Key Engineeering Materials*.

"Preparation of Thin Silicon–on–Insulator Films by Low–Energy Oxygen Ion Implantation" by Y Ishikawa and N Shibata Oct. 1991 *Japanese Journal of Applied Physics*.

"Analysis of thin–film silicon–on–insulator structures formed by low–energy oxygen ion implantation" (Kilner et al), Oct. 1991, 3605–3612 *J. Appl. Phys.* 70(7).

(List continued on next page.)

*Primary Examiner*—Tom Thomas
*Assistant Examiner*—S. Mulpuri
*Attorney, Agent, or Firm*—Robert D. Varitz

[57] ABSTRACT

The method is a technique for making silicon-on-insulator (SOI) wafers which are suitable for use in the production of CMOS devices, which are designed to operate with low power and low voltage. The method of the invention provides high quality SOI material at relatively low cost by implanting, in one form of the invention, a very low dose of nitrogen or oxygen ions at a very low energy into silicon, and thereafter diffusing oxygen during an annealing process to form a continuous buried layer of silicon-oxy-nitride ($Si_x O_y N_z$, or SON) or $SiO_2$. The process includes using an ion beam to implant ions into the substrate, thereby damaging a region of the crystal. The feed gas for the ion beam may be a variety of nitro-oxide gases, such as NO, $N_2O$, $NO_2$, as well as a simple mixture of nitrogen and oxygen gases. Other elemental ions may be implanted to create the desired crystal defects. The wafer is then annealed in an atmosphere that allows the diffusion of the second species, usually oxygen, through an upper layer of the substrate to the region wherein the crystal has been damaged, wherein the second species reacts with the damaged crystal material to form a thin layer of insulating material which is located a very small distance below the surface of the wafer.

21 Claims, 8 Drawing Sheets

OTHER PUBLICATIONS

"Formation of ultra thin SOI–layer by implantation of nitrogen" by R. Schork and H. Ryssel, Mar. 1992, 16–17, IEEE.

"Synthesis of buried insulating layers in silicon by ion implantation," by A. M. Ibrahim and A. A. Berezin, 1992, 285–300, *Materials Chemistry and Phsyics*.

"Silicon–On–Insulator by Oxygen Ion Implantation," by H. W. Lam and R. F. Pinnizzotto, Feb. 28, 1993, 554–558, *Journal of Crystal Growth/North Holland*.

"A Novel Approach for Simox Wafer Cost Reduction" by N. Meyyappan and T. Nakato, Oct. 1993, 1993 IEEE *Int'l SOI Conference*.

"Ion sources for microfabrication (invited)" by Timothy A. Grotjohn, Apr. 1994, 1298–1303 *Rev. Sci Instrum*, vol. 65, No. 4.

"Improvement of Surface Morphology of Simox Waters by High–Temperature Oxidation" by T Katayāma et al Oct. 1994, 75–76 *Proceedings '94 IEEE Int'l SOI Conf.*

"Thickness Increment of Buried Oxide In A Simox Wafer by High–Temperature Oxidation" (Nakashima et al) Oct. 1994, 71–72 *Proceedings '94 IEEE Int'l SOI Conf.*

METHOD OF TREATING SILICON TO OBTAIN THIN, BURIED INSULATING LAYER

BACKGROUND OF THE INVENTION

The invention relates to a method of treating a silicon wafer for forming a thin, buried layer of insulating material close to the surface of the wafer, and specifically to a process wherein a first ion species is implanted into the silicon to create crystal defects therein, and a second ion species is then diffused into the silicon to create an insulating layer.

Silicon-on-insulator (SOI) materials have been found to be particularly useful in ultra large scale integration (ULSI) complementary metal oxide semiconductor (CMOS) applications. One technique for making SOI materials is to implant nitrogen or oxygen ions into a silicon wafer. The implantation provides a layer of mixed phase material beneath the upper surface of the silicon, which layer contains varying degrees of crystal defects therein. Such implantation is normally conducted with relatively high energy implantation, in the range of 150 KeV to 1 MeV, producing ion doses on the order of $10^{18}$ cm$^{-2}$. Such activities were reported by Lam and Pinizzotto, *Journal of Crystal Growth*, North-Holland Publishing Company, 1983. Lam et al., and others have described a number of techniques for treating the defective layer formed by implantation, which usually involves high-temperature annealing to provide some cure to the defective region and to cause a reaction to form the insulating layer, thereby leaving a single crystal layer above the insulating layer. Traditionally, an epitaxial layer is then grown on the silicon in order to provide multiple layers for the construction of semiconductor structures. In the course of implantation, the silicon wafer is typically heated by both the implantation beam and external sources.

Fabrication of thin SOI films by low-energy oxygen ion implantation with relatively low doses of ions have been described by Ishikawa et al., *Japanese Journal of Applied Physics*, Vol. 30, No. 10, October, 1991, pages 2427–2431. In that report, oxygen ions were implanted at an energy of 15–30 KeV, and a resulting dose of approximately $10^{17}$ ion/cm$^2$. This resulted, in one instance, in an amorphous top Si layer of 48 nm and an SiO$_2$ layer thereunder of 61 nm. The interface between the top layer and the amorphous layer was 3.5 nm.

Ibrahim, *Materials Chemistry and Physics*, 31 (1992) (285–300), "Synthesis of Buried Insulating Layers in Silicon by Ion Implantation" suggest at 294, that simultaneous implantation using NO$^+$ or N$_2$O$^+$ molecules may result in the formation of buffed silicon-oxy-nitride layers. However, at 295, they discount this technique, stating that simultaneous implanting leaves an oxy-nitride layer too near the projected range, and that excess oxygen will accumulate at the interface of the silicon and oxy-nitride matrix, causing a deterioration, with depth, in the quality of the top single-crystal silicon.

Our previous U.S. Pat. No. 5,436,175, granted Jul. 25, 1995, discloses a method of forming shallow SIMOX (Separation by IMplantation of OXygen) substrates by implanting molecular oxygen ions into a substrate, in order to form a silicon dioxide (SiO$_2$) insulating layer. The process utilized a molecular ion implantation beam to implant a dose of molecular ions, either oxygen or nitrogen, having a dose of between $0.6 \cdot 10^{17}$ and $2.5 \cdot 10^{17}$ molecular ions per cm$^2$, and an energy range of between 60 KeV and 90 KeV. The substrate is annealed, which causes the implanted insulating element to react with the silicon, forming either SiO$_2$ or Si$_3$N$_4$. Alternatively, both oxygen and nitrogen may be implanted, with the substrates having the implanted materials then annealed to form a silicon-oxy-nitride (Si$_x$N$_y$O$_z$) insulating layer.

A drawback with the known prior art methods of making silicon-on-insulator products is that the wafer must be annealed for a rather lengthy period of time in order to cure the defects formed therein during the implantation process. This results from a variety of factors, including the relatively high energies that are used to implant an insulating substance, the depth of the insulating layer, and the requirement to diffuse other substances through the non-insulating layer to the defect or insulating layer.

SUMMARY OF THE INVENTION

The method of the invention provides a technique for making silicon-on-insulator (SOI) wafers which are suitable for use in the production of CMOS devices, which are designed to operate with low power and low voltage. The method of the invention provides high quality SOI material at relatively low cost by implanting, in one form of the invention, a very low dose of nitrogen or oxygen ions at a very low energy into silicon, and thereafter diffusing oxygen during an annealing process to form a continuous buried layer of silicon-oxy-nitride (Si$_x$O$_y$N$_z$, or SON) or SiO$_2$. The process includes using an ion beam to implant ions into the substrate. The feed gas for the ion beam may be a variety of nitro-oxide gases, such as NO, N$_2$O, NO$_2$, as well as a simple mixture of nitrogen and oxygen gases. Other elemental ions may be implanted to create the desired crystal defects. The wafer is then annealed in an atmosphere that allows the diffusion of the second species, usually oxygen, through an upper layer of the substrate to the region wherein the crystal has been damaged, wherein the second species reacts with the damaged crystal material to form a thin layer of insulating material which is located a very small distance below the surface of the wafer.

It is an object of the invention to provide a high-quality SOI material at low cost.

A further object of the invention is to provide an SOI material by implanting a substance in a silicon substrate, and then diffusing another, or the same, substance into the silicon substrate to form an insulating layer.

Another object of the invention is to provide a high-quality SOI which has a thin insulating layer under a thin layer of silicon.

Yet another object of the invention is to perform such implanting at a relatively low temperature.

These and other objects and advantages of the invention will become more fully apparent as the description which follows is read in connection with the drawings.

BEST MODE OF PRACTICING THE INVENTION

Figure 1:
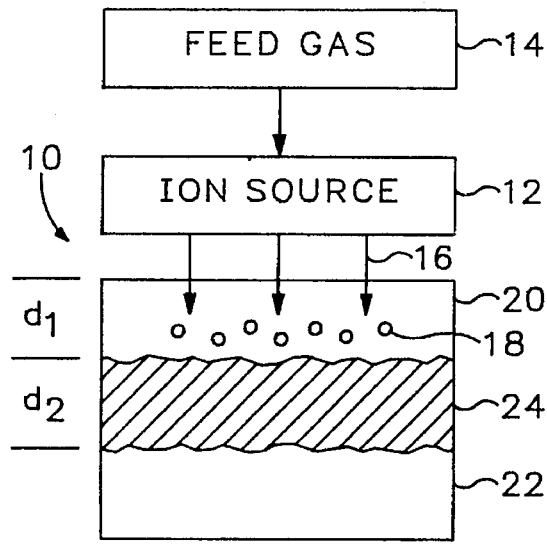
FIG. 1 is flow chart/schematic cross-section of a silicon substrate having an implanted layer depicted therein.

The method of the invention disclosed herein was discovered while attempting to make a silicon nitride insulating layer in a silicon substrate. An unexpected result of the implantation and annealing process was the formation of a silicon-oxy-nitride layer which was obtained by implanting nitrogen, at very low energy and extremely low ion doses in a silicon substrate and then anneal the substrate in a nitrogen ambient atmosphere with the addition of a small amount of oxygen gas. Rutherford back-scattering spectroscopy (RBS) analyses were done on the substrate before and after annealing, and cross-section transmission electron microscope (XTEM) analysis was performed after the anneal The analyses revealed a single crystal silicon layer above a continuous buried layer of an insulating silicon-oxy-nitride layer.

In one method of practicing the invention, a dose of selected nitrogen ions is accelerated and implanted at a given ion energy level into a single-crystal silicon substrate or wafer, which substrate or wafer is held at an elevated temperature. The elevated temperature may be the result of the implanting process itself, i.e., no additional heat is supplied. The nitrogen ions, upon entering the silicon substrate, gain electrons to become atoms, which, after collisions with the silicon atoms, damage the silicon crystal, lose energy, and eventually come to rest at a known depth as a layer of $Si_xN_y$. After implantation, the substrate is annealed at high temperature in an inert atmosphere, such as nitrogen or argon, with some small percentage of oxygen. During the annealing process, oxygen diffuses through the upper silicon surface to reach the implanted nitrogen atoms. The damaged crystal region acts as a sink for the incoming oxygen atoms. A reaction takes place between the implanted nitrogen atoms, the diffused oxygen atoms, and the silicon atoms of the substrate to form a buried insulating layer of silicon-oxy-nitride (SON). The oxygen atoms nucleate into islands and coalesce to form a thin, buried dielectric layer. Other forms of the invention implant ions of other elements, such as oxygen, argon, germanium and silicon, to cause crystal damage below the surface of the wafer.

High-temperature annealing is known to remove crystal damage in the silicon. During this process, a thin silicon dioxide layer will form on the top surface of the silicon substrate due to the presence of oxygen in the annealing ambient atmosphere, which layer will later be etched away. Thus, a very thin silicon layer will remain on top of a very thin insulating SON layer. The SON layer will begin forming from the top interface and continue to grow as more oxygen is diffused into the damaged crystal region, eventually forming a relatively thin layer of SON. After a predetermined amount of time in the annealing furnace, the flow of oxygen may be stopped in order to allow the remaining oxygen in the silicon film to diffuse into the buffed layer, thus forming an oxygen-free silicon top layer. If $O^+$ ions are implanted, the damaged region will be predominantly $SiO_2$.

Referring now to FIG. 1, a silicon substrate is represented generally at 10. The substrate is prepared by conventional methods: a single crystal silicon ingot is formed into wafers, which are ultimately used in the manufacture of integrated circuits.

Figure 2:
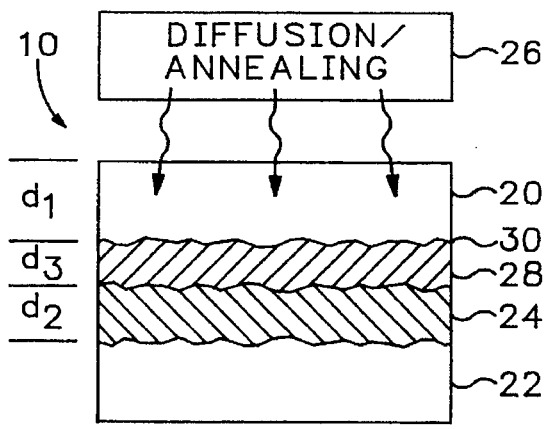
FIG. 2 is a schematic cross-section of a silicon substrate representing a reaction which occurs during the annealing process.

An ion source 12, which is part of an ion implant apparatus, is connected to a source of feed gas 14. Ion source 12 is operable to form an ion beam 16 which implants ions 18, of a species A, into substrate 10. FIG. 1 depicts the process after implantation has taken place for some time. Substrate 10 includes, at this point, an upper silicon layer 20, having a thickness $d_1$, a lower silicon layer 22, and an implanted layer 24, having a thickness $d_2$. Layer 24 contains damaged crystalline structures therein, which damaged crystals are susceptible to reacting with substances, such as species B, which are introduced during the diffusion and annealing step, as depicted at 26 in FIG. 2. As diffusion and annealing continues, an amorphous layer 28 begins to form in implanted layer 24. The interface 30 located between upper silicon layer 20 and implanted layer 24 has an irregular surface at this point in the process. The same is also true for the interface between layer 24 and layer 22.

Figure 3:
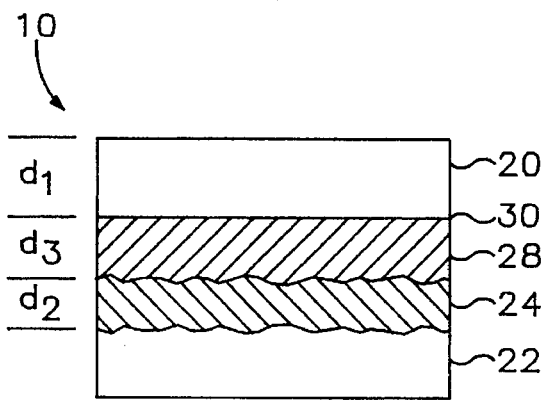
FIG. 3 is a schematic cross-section of an SOI material.

FIG. 3 represents the substrate at the termination of the annealing step wherein implanted layer 24 largely has been converted to amorphous layer 28, having a thickness $d_3$, due to the reaction of the diffused material into the substrate, through upper silicon layer 20 and into the damaged region of implanted layer 24. Interface 30 has smoothed slightly at this point in the process. A non-converted portion of layer 24 remains between layer 28 and layer 22.

Ion source 12 operates with a feed gas 14. Feed gas 14 may be $N_2O$, NO, or a mixture of $N_2$ and $O_2$. The ion implant apparatus 12 contains appropriate controls to eliminate undesired ions and provide an ion beam of the desired composition and energy. As previously noted, species, or substance, A may be a molecular ion source which may be either $O_2^+$, $N_2^+$, or molecular ions of Ar, Ge or Si. In the case where species A is $O_2^+$, the preferred implanting energy used with ion source 12 is approximately 30 KeV/atom-ion, and the dose of ions implanted in substrate 10 is less than $5 \cdot 10^{16}$ $cm^{-2}$. Where species A is $N_2^+$, the preferred implanting energy is about 40 KeV/atom-ion, and the implanted ion dose is less than $5 \cdot 10^{17}$ $cm^{-2}$, and may be about $5 \cdot 10^{16}$ $cm^{-2}$. The ion source may use atomic or molecular ions. When a molecular ion is used, the implanting energy must take into account the additional atoms which are present in the molecule. As used herein, "atom-ion" means the energy level per atom in the ion, i.e., if the ion is a single atom, for instance, $N^+$, the implanting energy is one half that of that required to implant a molecular ion, for instance, $N_2^+$.

A number of experiments have been conducted in order to optimize the method of the invention. Silicon wafers were implanted at very low ion energy and extremely low ion doses of nitrogen, at a substrate temperature in a range of between 500° C. and 700° C., with the optimum temperature being 550° C. However, implanting was also done at an "ambient" temperature of 100° C. to 500° C., where the implanting temperature is solely the result of the energy released by the implanting process. Implanting is usually carried out at 1) an elevated temperature, which requires an additional heat source, or, 2) at a lower than ambient temperature. Four different nitrogen ion doses were used at two different energy levels: Sample 1: $1 \cdot 10^{17}$ $cm^{-2}$ at 25 KeV, Sample 2: $7.5 \cdot 10^{16}$ $cm^{-2}$ at 25 KeV, Sample 3: $5 \cdot 10^{16}$ $cm^{-2}$ at 25 KeV, and Sample 4: $2 \cdot 10^{17}$ $cm^{-2}$ at 30 KeV. In all instances, the implanting energy was less than 40 KeV/atom-ion.

Empirical evidence and theoretical results suggest that a range of 10 KeV/atom-ion to 60 KeV/atom-ion is appropriate for the method of the invention. Optimum values for the process with $O^+$ as species A appears to be about 30 KeV/atom-ion at a dose of $5 \cdot 10^{16}$ $cm^{-2}$, followed by additional $O_2$, equivalent to an implanted dose of $1 \cdot 10^{17}$ $cm^{-2}$ during the diffusion/annealing step. When $N^+$ is used as species A, an implant energy of 30 KeV/atom-ion and a dose of $5\cdot10^{16}$ cm$^{-2}$ appears to provide optimum results. If $N_2^+$ is used as species A, an implant energy of 60 KeV/atom-ion and a dose of $2.5\cdot10^{16}$ cm$^{-2}$ appears to be optimal. The use of $N_2^+$ allows a dosing range, however, of $1\cdot10^{16}$ cm$^{-2}$ to $1\cdot10^{17}$ cm$^{-2}$.

The wafers were annealed in multiple batches, according to the implant energy, under otherwise identical conditions. High-temperature annealing was accomplished using a temperature range of between 1200° C. to 1400° C. for between two and sixteen hours, with the optimum annealing being done at 1300° C. for six hours. The annealing took place in a nitrogen-ambient atmosphere which included a small amount of oxygen gas, which was less than 1% of the total atmosphere. The atmosphere could also be an argon-ambient, or a combination of nitrogen and argon.

Referring again to FIGS. 1–3, in the instance where species A is nitrogen, implanted layer 24 generally will comprise $Si_3N_4$. Where oxygen is used as species A and species B, layer 24 will be $SiO_2$, and will react to form an insulating layer 28 which is still predominately $SiO_2$, which is formed from a low implant dose of $O^+$, which causes less crystalline damage and takes less energy and time. Additional oxygen is provided during the diffusion/annealing step, resulting in a better, less costly buried insulating layer than that described in our previously cited U.S. Pat. No. 5,436,175. Where species A is nitrogen and species B is oxygen, layer 24 will react to form a silicon-oxy-nitride ($Si_xN_yO_z$) layer. Where species A is $Ar^+$, $Ge^+$ or $Si^+$, layer 24 will be a compound of Si and species A. When a wafer so implanted is annealed in a low-oxygen environment, layer 24 will react with the diffused oxygen to form $SiO_2$.

During the annealing process, the silicon wafer surface oxidizes to form a thin layer of silicon dioxide. Oxygen diffuses through this silicon dioxide layer into upper silicon layer 20 and continues to diffuse until it reaches implanted layer 24, to form an amorphous insulating layer 28. This layer continues to grow from interface 30 towards the bottom of implanted layer 24 as a function of time. Assuming that sufficient time is allowed, and sufficient oxygen is available, the entire implanted layer may be converted into SON, however, this is not necessary so long as a sufficiently thick insulating layer is formed in the region of the implanted layer. The nitrogen-implanted region, where no oxygen was available, i.e., the lower part of the buried layer, tended to react to form a silicon nitride containing some silicon precipitates.

Figure 4:
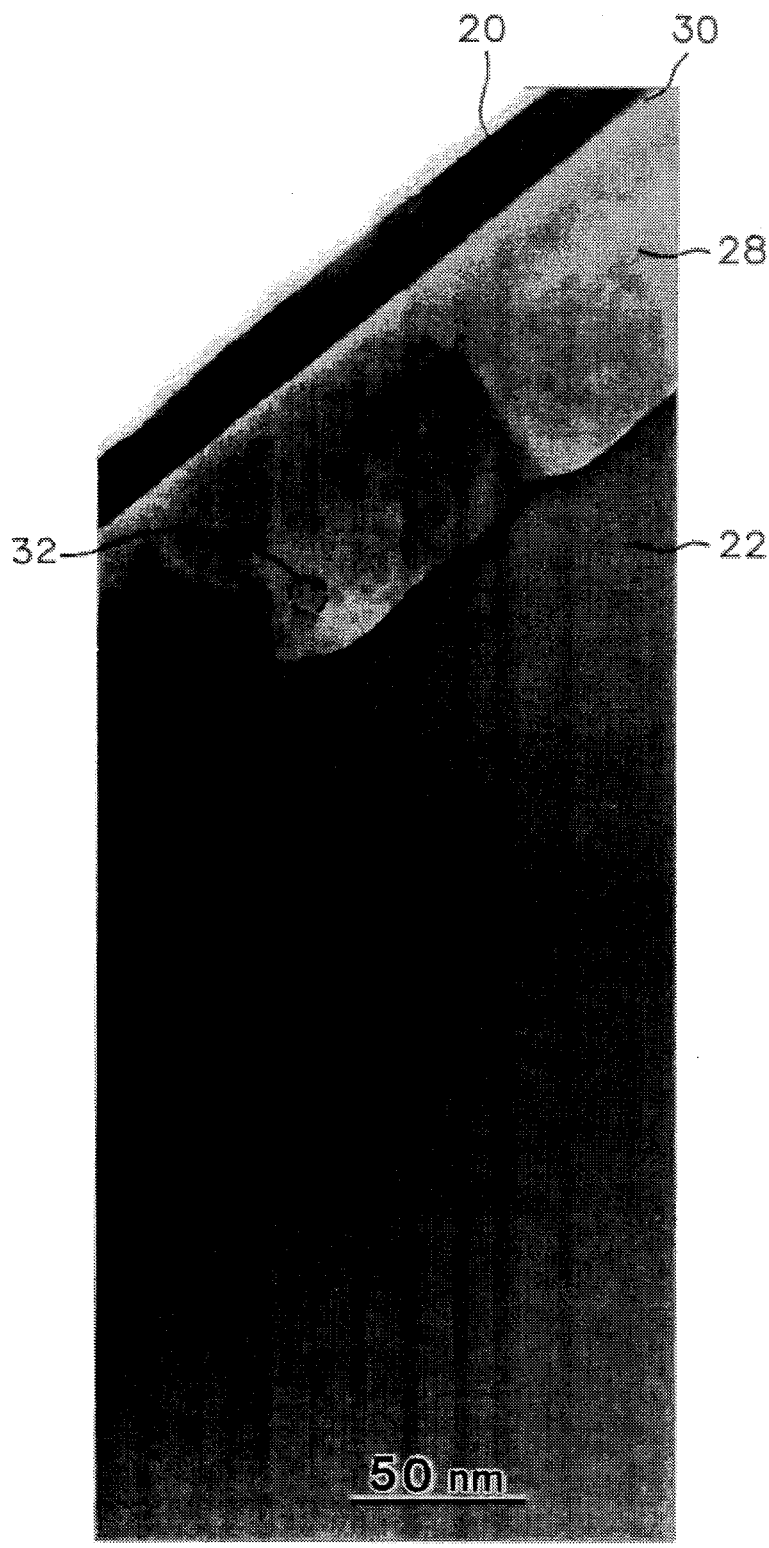
FIGS. 4–9 are XTEM photomicrographs of SOI material made using the method of the invention.
Figure 5:
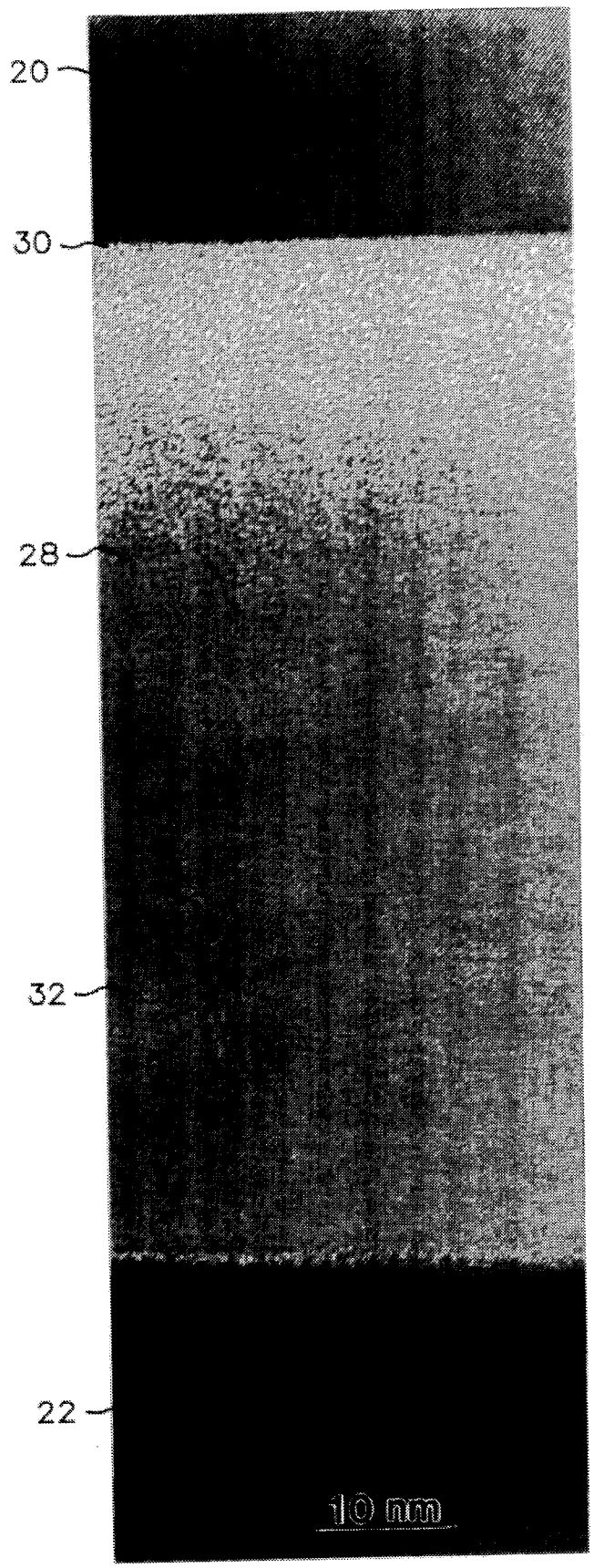

Referring now to FIGS. 4 and 5 are XTEM photomicrographs of the sample 1 are depicted. FIG. 4 depicts a top layer 20 having a thickness $d_1$ of 17 nm, and an insulating layer 28 of a silicon-oxy-nitride compound having a thickness $d_3$ of 19 nm. Interface 30 may be seen to be exceptionally sharp between the silicon and the SON layer. Dark spots, such as 32, which are present in layer 28 may be better seen in FIG. 5, as including areas of silicon precipitate or $Si_xN_y$ material. The lattice structure, which is evident in the original photographs, suggests that the precipitates are predominantly silicon as they have substantially the same appearance as the lattice structure in layer 22.

Figure 6:
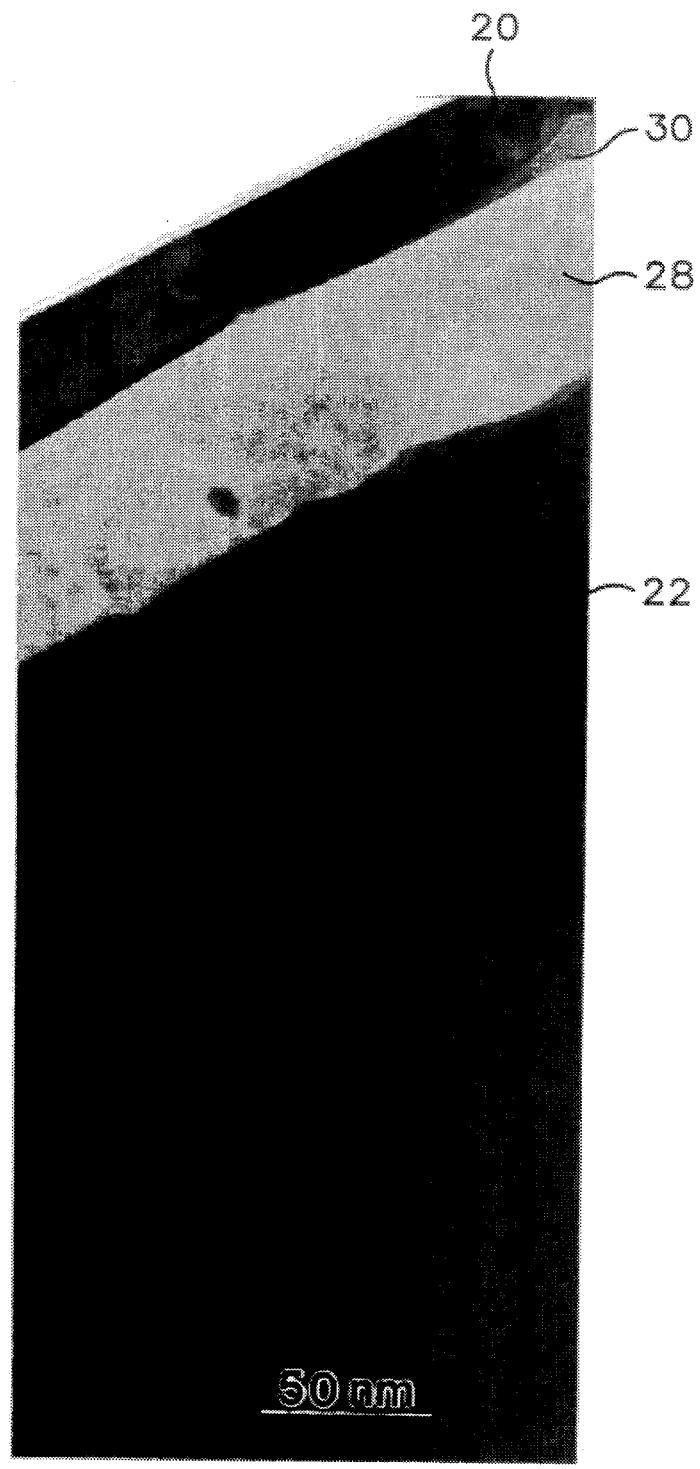
Figure 7:
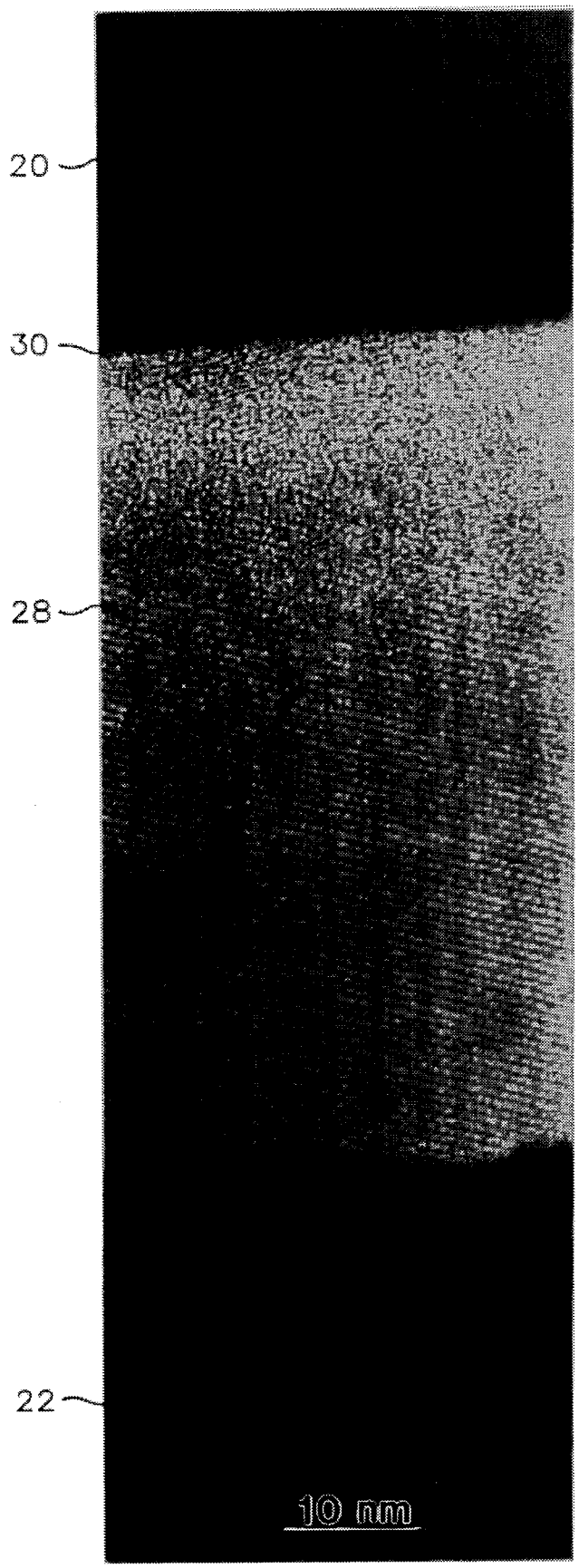
Figure 8:
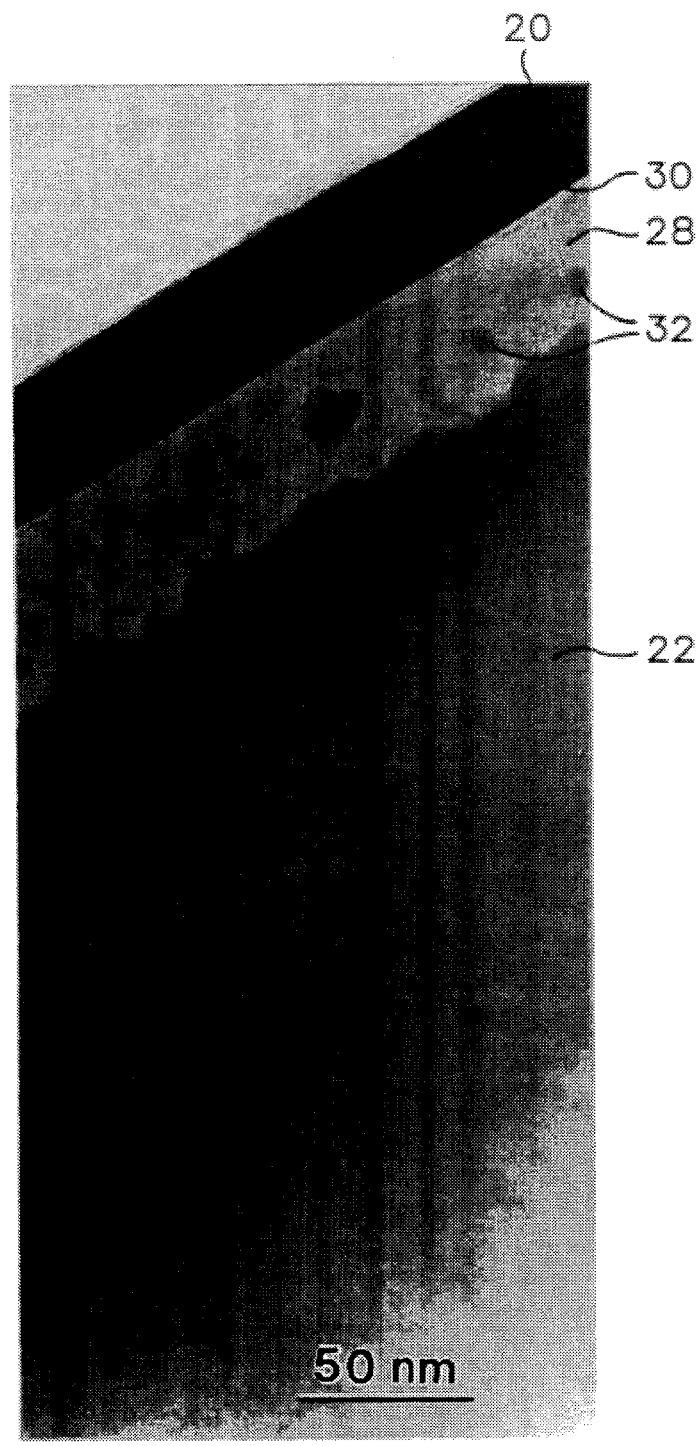
Figure 9:
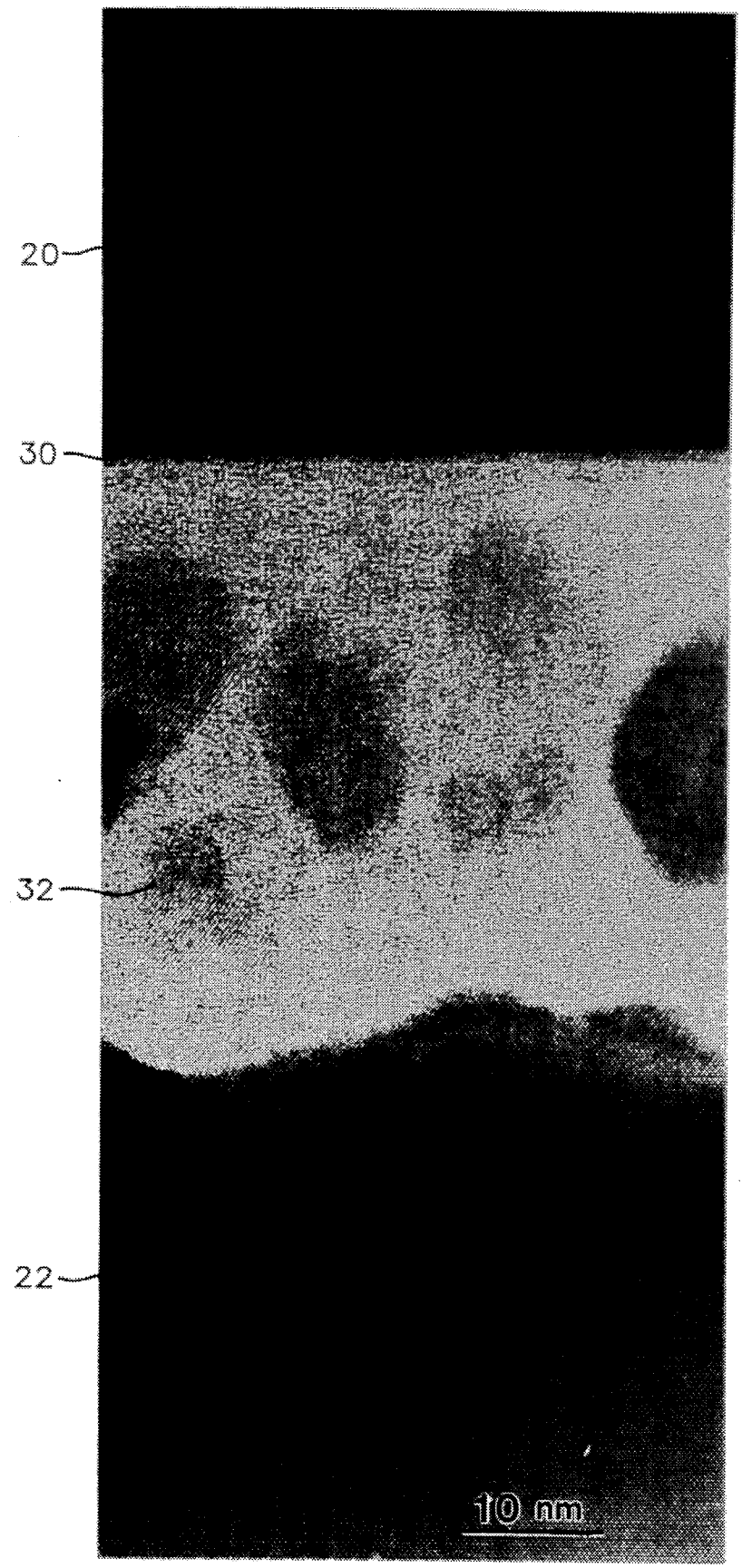

FIGS. 6 and 7 are XTEM photomicrographs of sample 2, which show a thicker amorphous buried layer 28, although interface 30 is somewhat irregular. FIGS. 8 and 9 depict sample 3 and show an exceptionally sharp interface 30 and an amorphous layer 28 having silicon precipitates formed therein. The interface between layer 24 and 22 is seen to be quite irregular in this sample.

Figure 10:
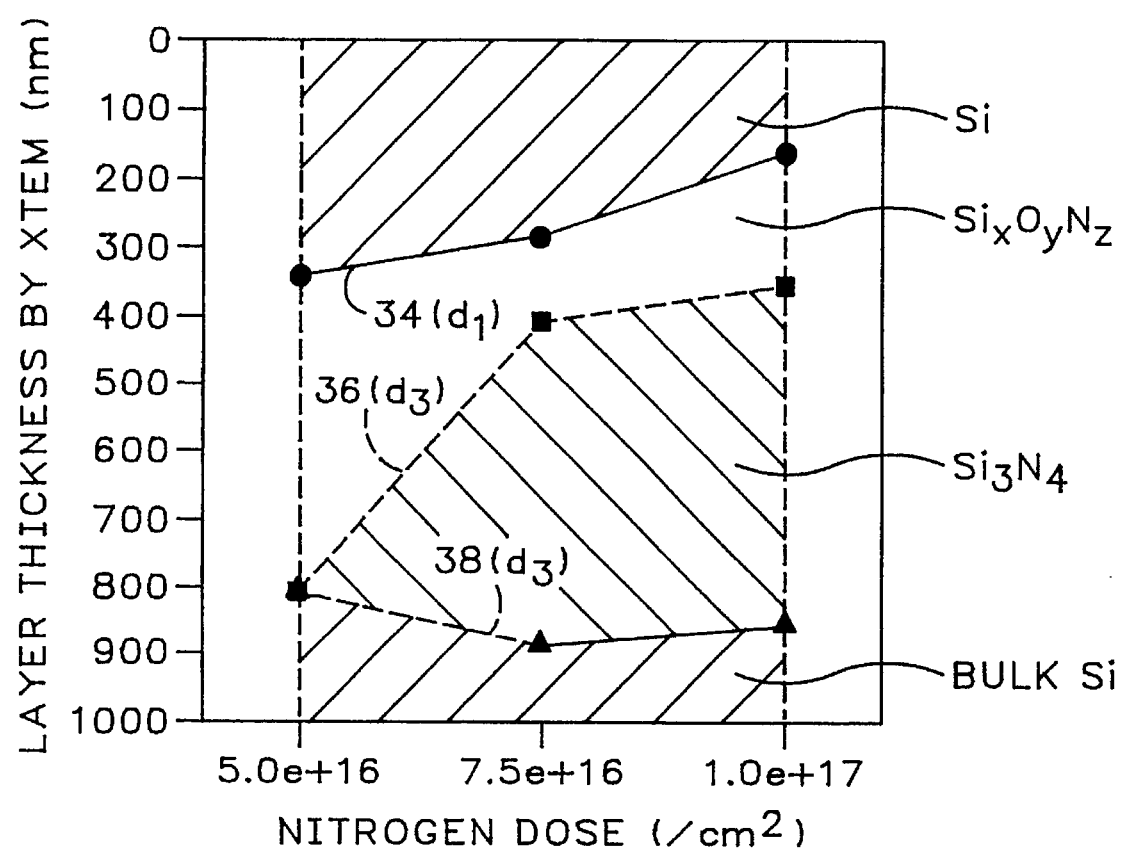
FIG. 10 is a graph representing composition vs. depth of the substrate and insulating layer for three different ion doses.

FIG. 10 is a depth profile taken from experimental data (XTEM) depicting the layer thicknesses of $d_1$, $d_2$, and $d_3$ of substrate 10 at various depths and for various doses of $N^+$ ions. Trace 34 ($d_1$) depicts the lower boundary of the upper silicon layer 20, and represents interface 30. Trace 36 ($d_3$) depicts the lower boundary of the SON layer, while trace 38 ($d_2$) depicts the lower boundary of the original implanted layer. It is desired to form the thinnest possible remaining implanted-unreacted layer $d_2$.

Thus, a method for producing ultra-thin silicon on insulator wafers having a buried layer of silicon-oxy-nitride has been disclosed. The use of the low implant dose of the species A material significantly reduced the implant time thereby increasing productivity. The low implant dose also produces less damage to the silicon which leads to lower defect densities, decreased contamination and requires a shorter annealing time.

INDUSTRIAL APPLICABILITY

This process is useful for the high-volume manufacturing of silicon-on-insulator material at a lower cost as compared with other manufacturing techniques, such as SIMOX. The material produced is particularly suited for ultra-large-scale integration CMOS applications, where the thickness of the silicon-on-insulator and buried layers are approximately 50 nm each.

We claim:

1. A method of forming a buried insulating film in a silicon substrate comprising the following steps:
    (a) providing an ion source of a species A;
    (b) forming a ion beam from the ion source;
    (c) implanting ions into the substrate using the ion beam of step (b) to a depth, $d_1$;
    (d) annealing the dosed substrate in an atmosphere having an amount of a second species, B, therein;
    (e) diffusing species B into the substrate during annealing to the depth of (c);
    (f) reacting species B with the substrate and implanted species A, thereby forming a buried layer of insulating material within the substrate.

2. The method of claim 1 wherein the ion source of species A is a molecular ion source taken from the group consisting of $O_2^+$, $N_2^+$, $Ar^+$, $Ge^+$ and $Si^+$.

3. The method of claim 2 wherein species A is $O^+$, the implanting energy is about 30 KeV/atom-ion, and the dose of species A is less than $5\cdot10^{16}$ cm$^{-2}$.

4. The method of claim 2 wherein species A is $N^+$, the implanting energy is about 30 KeV/atom-ion, and the dose of species A is less than $5\cdot10^{17}$ cm$^{-2}$.

5. The method of claim 4 wherein an $N_2^+$ ion dose is about $2.5\cdot10^{16}$ cm$^{-2}$.

6. The method of claim 1 wherein the implanting energy is about 25 KeV/atom-ion.

7. The method of claim 1 wherein the implanting energy is in a range of about 10 KeV/atom-ion to 60 KeV/atom-ion.

8. The method of claim 1 wherein species B is $O_2$, wherein the atmosphere contains a small amount of $O_2$, and wherein oxygen equivalent to an implanted dose in a range of about $5\cdot10^{16}$ cm$^{-2}$ to $5\cdot10^{17}$ cm$^{-2}$ is diffused to the depth of step (c).

9. The method of claim 1 wherein the ion source is a source of molecular ions which are taken from the group consisting of $N_2^+$ and $O_2^+$ mix, $N_2O^+$, $NO_2^+$, $N_2O_2^+$, $NO^+$, $Ar^+$, $Ge^+$ and $Si^+$.

10. The method of claim 1 wherein a feed gas for the ion source is taken from the group consisting of $N_2O$, $N_2$, $O_2$ and a mixture of $N_2$ and $O_2$.

11. The method of claim 1 wherein said implanting includes maintaining the substrate in a temperature range of about 500° C. to 700° C., and preferably at a temperature of about 550° C.

12. The method of claim 1 wherein said implanting includes maintaining the substrate at an ambient temperature, of about 100° C. to 500° C., wherein the substrate is heated by the implantation process and is not cooled by an external source of coolant.

13. The method of claim 1 wherein said annealing step includes maintaining the substrate at a temperature in a range of about 1200° C. to 1400° C. for about 2 to 16 hours in an ambient atmosphere taken from the group consisting of $N_2$ and Ar.

14. The method of claim 1 wherein the formed buried insulating layer has a depth $d_1$ in the substrate in a range of about 10 nm to 100 nm and a thickness $d_3$ in a range of about 30 nm to 100 nm.

15. A method of forming a buried insulating film in a silicon substrate comprising the following steps:

(a) providing a source of $N^+$ ions;
  (b) forming an ion beam from the ions wherein the ion beam has an implanting energy in a range of about 10 KeV/atom-ion to 60 KeV/ion-atom;
  (c) implanting ions into the substrate using the ion beam of step (b) wherein the ion dose is less than $5 \cdot 10^{17}$ $cm^{-2}$;
  (d) annealing the dosed substrate while maintaining the substrate at a temperature in a range of about 1200° C. to 1400° C. for about 2 to 16 hours in an ambient atmosphere taken from the group consisting of $N_2$ and Ar, with an $O_2$ concentration of less than 1% therein
  (e) step (d) further includes diffusing oxygen into the substrate during said annealing step thereof and reacting the oxygen with the implanted nitrogen and the silicon substrate to form buried layer of silicon-oxy-nitride.

16. The method of claim 15 wherein the ion source is a molecular ion source of $N_2^+$ and the implanting energy is less than 120 KeV.

17. The method of claim 15 wherein the implanting energy is about 25 KeV/atom-ion.

18. The method of claim 15 wherein the ion source is a source of molecular ions which are taken from the group consisting of an $N_2^+$, $N_2O^+$, $NO_2^+$, $N_2O_2^+$ and $NO^+$.

19. The method of claim 15 wherein said implanting includes maintaining the substrate at an ambient temperature, of between 100° C. and 500° C., wherein the substrate is heated by the implantation process and is not cooled by an external source of coolant.

20. The method of claim 15 wherein the buried insulating layer has a depth $d_1$ in the substrate in the range of about 10 nm to 100 nm and a thickness $d_3$ in the range of about 30 nm to 100 nm.

21. A method of forming a buried insulating film in a silicon substrate comprising the following steps:

(a) providing a source of ions, wherein the ion source is a source of molecular ions which are taken from the group consisting of $N_2^+$, $N_2O^+$, $NO_2^+$, $N_2O_2^+$ and $NO^+$;
  (b) forming an ion beam from the ions wherein the ion beam has an implanting energy less than 120 KeV;
  (c) implanting $N^+$ ions into the substrate using the ion beam of step (b) wherein the ion dose is in a range of about $1 \cdot 10^{16}$ $cm^{-2}$ to $1 \cdot 10^{17}$ $cm^{-2}$;
  (d) maintaining the substrate at a temperature range of about 500° C. to 700° C.; and
  (e) annealing the dosed substrate while maintaining the substrate at a temperature in a range of about 1200° C. to 1400° C. for about 2 to 16 hours in an ambient atmosphere taken from the group consisting of $N_2$ and Ar, with an $O_2$ concentration of less than 1% therein;
  (f) diffusing oxygen into the substrate during annealing thereof;
  (g) reacting the oxygen with the implanted nitrogen and the silicon substrate; and
  (h) forming a buried insulating layer of silicon-oxy-nitride wherein the buried insulating layer has a depth $d_1$ in the substrate in the range of about 10 nm to 100 nm and a thickness $d_3$ in the range of about 30 nm to 100 nm.

* * * * *